United States Patent
Lu (10) Patent No.: US 7,288,438 B2
(45) Date of Patent: Oct. 30, 2007

(54) SOLDER DEPOSITION ON WAFER BACKSIDE FOR THIN-DIE THERMAL INTERFACE MATERIAL

(75) Inventor: Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/116,554

(22) Filed: Apr. 28, 2005

(65) Prior Publication Data

US 2006/0244148 A1 Nov. 2, 2006

(51) Int. Cl.
*H01L 21/00* (2006.01)
(52) U.S. Cl. ............... 438/122; 257/625; 257/E23.101
(58) Field of Classification Search ............... 438/122; 257/625, 675, 720
See application file for complete search history.

(56) References Cited

U.S. PATENT DOCUMENTS

| | | | |
|---|---|---|---|
| 5,956,576 A | * | 9/1999 | Toy et al. .................. 438/125 |
| 6,724,078 B1 | * | 4/2004 | Sur et al. .................... 257/704 |
| 6,987,671 B2 | * | 1/2006 | Houle ........................ 361/704 |
| 7,075,180 B2 | * | 7/2006 | Narendra et al. ........... 257/707 |
| 2004/0188814 A1 | * | 9/2004 | Houle et al. ................ 257/678 |
| 2004/0227229 A1 | * | 11/2004 | Hu et al. .................... 257/707 |

OTHER PUBLICATIONS

Stefan Weib et al., "Design, Simulation and Technological Realization of a Reliable Packaging Concept for High Power Laser Bars" IEEE, Electronic Components and Technology Conference, 1998, pp. 1395-1401.*

* cited by examiner

*Primary Examiner*—David W. Coleman
(74) *Attorney, Agent, or Firm*—Schwegman, Lundberg & Woessner, P.A.

(57) ABSTRACT

A solder is deposited on the backside of a wafer. The wafer can be pre-deposited with a barrier layer such as a titanium base and other materials. Deposition is carried out by electroplating, electroless plating, chemical vapor deposition, and physical vapor deposition. The solder-deposited die is bonded with a heat spreader that did not require a pre-deposited solder.

24 Claims, 8 Drawing Sheets

SOLDER DEPOSITION ON WAFER BACKSIDE FOR THIN-DIE THERMAL INTERFACE MATERIAL

TECHNICAL FIELD

Embodiments relate generally to integrated circuit fabrication. More particularly, embodiments relate to heat management technology with microelectronic devices.

TECHNICAL BACKGROUND

Heat spreaders are used to remove heat from structures such as an integrated circuit (IC). An IC die is often fabricated into a microelectronic device such as a processor. The increasing power consumption of processors results in tighter thermal budgets for a thermal solution design when the processor is employed in the field. Accordingly, a thermal interface solution is often needed to allow the die to reject heat more efficiently.

Various techniques have been employed to transfer heat away from an IC. These techniques include passive and active configurations. One passive configuration involves a conductive material in thermal contact with the backside of a packaged IC. This conductive material is often a heat pipe, heat sink, a slug, a heat spreader, or an integrated heat spreader (IHS).

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a solder thermal interface material (TIM) that is disposed between and die and heat spreader. Embodiments also relate to solder TIM metallurgies that are useful for heat solutions with microelectronic devices.

The following description includes terms, such as upper, lower, first, second, etc. that are used for descriptive purposes only and are not to be construed as limiting. The embodiments of an apparatus or article described herein can be manufactured, used, or shipped in a number of positions and orientations.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

Figure 1:
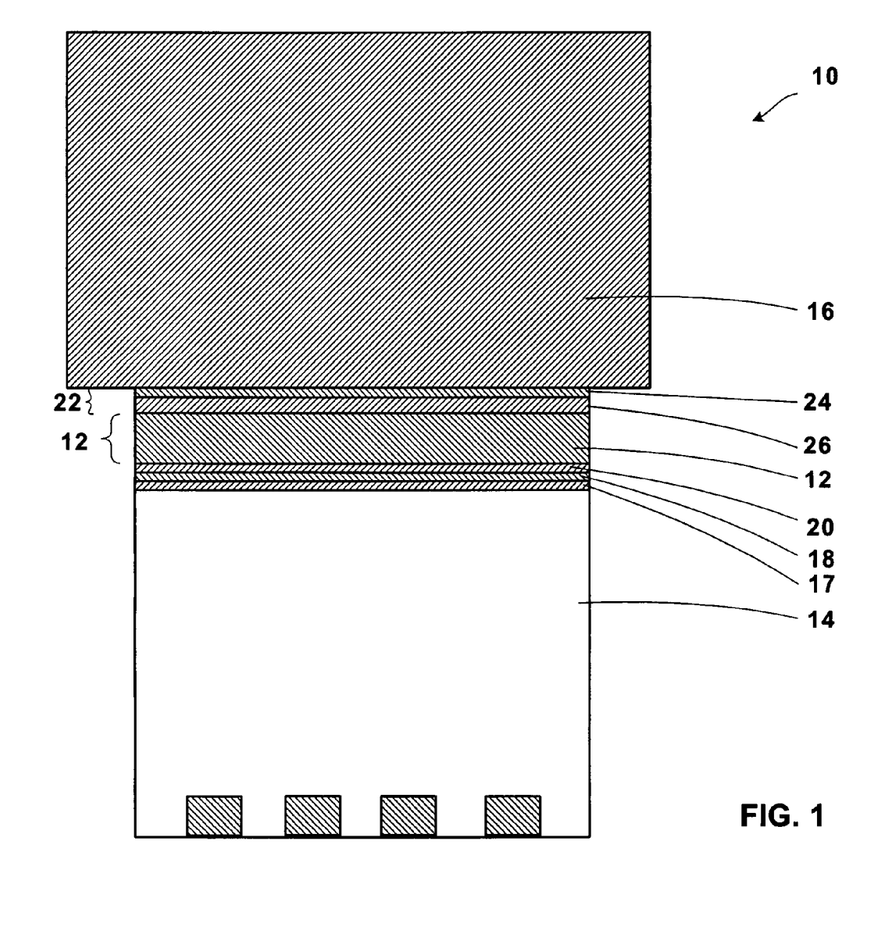
FIG. 1 is a computer-image depiction of a photomicrograph that exhibits a solder thermal interface material between a die and a heat spreader according to an embodiment.

FIG. 1 is a computer-image depiction of a photomicrograph that exhibits a solder thermal interface material (TIM) 12 between a die 14 and a heat spreader 16 according to an embodiment. The computer image photomicrograph is depicted in exaggerated vertical dimensions for illustrative purposes.

In an embodiment, the die 14 is a semiconductive material such as monocrystalline silicon that has been processed into integrated circuits (ICs). In an embodiment, the die 14 has a backside metallurgy (BSM) layer including a titanium first layer 17, a nickel-vanadium second layer 18 and a gold third layer 20. Further the die 14 has been bonded to the heat spreader 16 with the solder TIM 12 according to an embodiment. In an embodiment, the heat spreader 16 has been prepared with cladding 22 that includes a nickel layer 24 and a gold layer 26.

In an embodiment, the photomicrograph refers to a portion of an article 10 in which the solder TIM 12 has a voids fraction that is less than about 1%. In an embodiment, the article 10 includes a solder TIM 12 that has a voids fraction that is less than about 0.5%. In an embodiment, the article 10 includes a solder TIM 12 that has a voids fraction that is less than about 0.1%. The voids fraction can be analyzed by any known method, such as the Archimedes method, which determines a known density for a given eutectic solder.

In an embodiment, the solder TIM 12 is a gold-tin composition such as an 80:20 Au:Sn as rated by weight comparisons. In an embodiment, the solder TIM 12 has an area that is restricted to the backside area and dimension of the die 14.

Figure 2A:
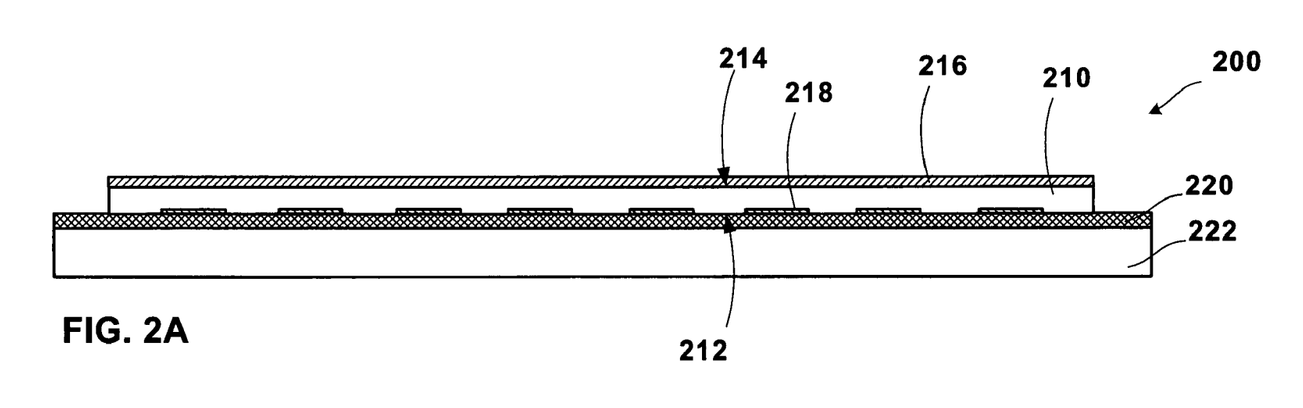
FIG. 2A is an elevational cross-section of a structure during processing of a wafer 210 according to an embodiment.

FIG. 2A is an elevational cross-section of a structure 200 during processing of a wafer 210 according to an embodiment. In a process embodiment, the wafer 210 is prepared for the deposition of what will become a backside TIM. The wafer 210 includes an active surface 212 and a backside surface 214. Accordingly, the wafer 210 can be prepared after the substantial completion of wafer fabrication of an array of unsingulated microelectronic devices. One of the unsingulated microelectronic devices is depicted schematically by the reference numeral 218.

In an embodiment, preparation of the wafer 210 includes forming a BSM 216 upon the backside surface 214 of the wafer 210. In an embodiment, the BSM 216 is a Au—NiV composite layer such as the cladding 22 depicted in FIG. 1. In another embodiment, the BSM 216 is a NiV or Ni layer.

In an embodiment, the BSM 216 is formed after a wafer thinning process. In an embodiment, backside grinding has been accomplished by pressing the wafer 210 against an active-surface adhesive layer 220 and a wafer support substrate 222, and removing a significant amount of semiconductive material to expose the backside surface 214 as depicted. In an embodiment, the wafer 210 is thinned to a thickness in a range from about 10 micrometer (μm) to about 300 μm. Other thicknesses can be achieved according to specific applications.

After backside grinding and BSM deposition, the wafer 210 is ready for the formation of a solder TIM. In an embodiment, a plating process is carried out. The wafer 210 is immersed with the BSM 216 exposed, such that the BSM is connected as a cathode. A solder-precursor first layer 226 is electroplated onto the BSM 216, followed by a solder-precursor second layer 228. In an example embodiment, the solder-precursor first layer 226 is gold. Thereafter, the wafer 210 is immersed in a tin-plating bath, and the solder-precursor second layer 228 is formed.

In an embodiment, other deposition processes are used. In an embodiment, the solder-precursor layers 226 and 228 respectively, or one of them, are formed by electroless plating. In an embodiment, the solder-precursor layers 226 and 228 respectively, or one of them, are formed by physical vapor deposition. In an embodiment, the solder-precursor layers 226 and 228 respectively, or one of them, are formed by chemical vapor deposition. In an embodiment, the solder-precursor layers 226 and 228 respectively, are formed by a combination of two or more of the processes set forth in this disclosure.

Figure 2B:
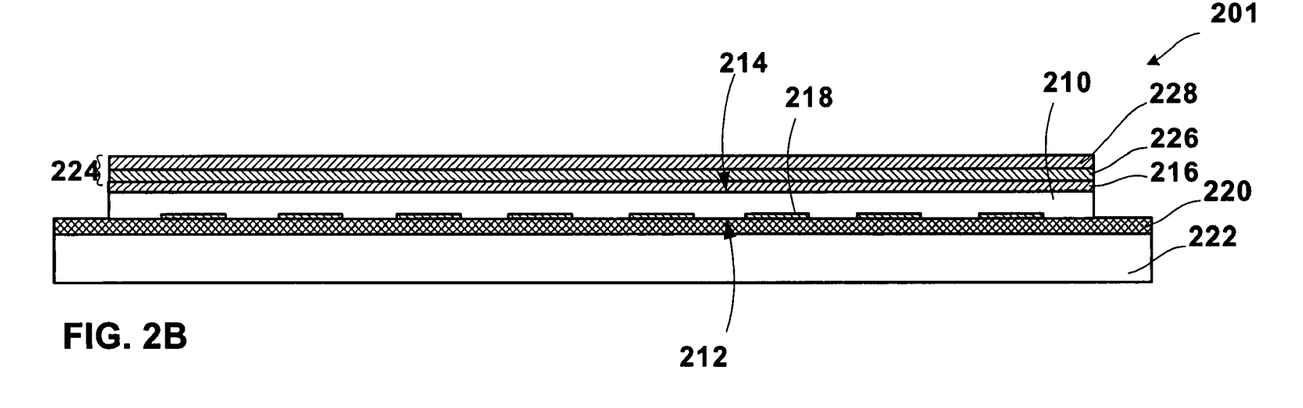
FIG. 2B is an elevational cross-section of the structure depicted in FIG. 2A during further processing according to an embodiment.

FIG. 2B is an elevational cross-section of the structure depicted in FIG. 2A during further processing according to an embodiment. The structure 201 has been processed to include a solder-laminate precursor 224 according to an embodiment. In an embodiment, the solder-laminate precursor 224 includes a gold first layer 226 and a tin subsequent layer 228. In an embodiment, the gold first layer 226 and the tin subsequent layer 228 are present in an Au:Sn ratio of about 80:20 by weight. In an embodiment, the solder-laminate 224 includes more than two layers. In an embodiment, the solder-laminate 224 includes only one layer of a solder such as eutectic AuSn solder, eutectic SnAg solder, Sn, In and the like.

Other solder-laminate precursors can be used to form the solder TIM 224. In an embodiment, the solder-laminate precursor 224 is a solder. In an embodiment, the solder-laminate precursor 224 is a lead-containing solder. In an embodiment, the solder-laminate precursor 224 is a tin-containing solder. In an embodiment, the solder-laminate precursor 224 is a gold-tin solder. In an embodiment, the solder-laminate precursor 224 is a copper-tin solder. In an embodiment, the solder-laminate precursor 224 is a tin-indium solder. In an embodiment, the solder-laminate precursor 224 is a copper-tin-indium solder. In an embodiment, the solder-laminate precursor 224 is a gold-copper-tin solder. In an embodiment, the solder-laminate precursor 224 is a tin solder. In an embodiment, the solder-laminate precursor 224 is a indium solder.

In each embodiment, a combination of at least a first metal and a subsequent metal is achieved that behaves as a eutectic upon reflow processing. In an embodiment, a combination of at least a first metal and the subsequent metal are such that substantially no intermetallic phase is present. By "substantially no intermetallic phase", it is meant that intermetallics in the solder are present below about 1%. In an embodiment, "substantially no intermetallic phase" means that intermetallics in the solder are present below about 0.1%.

The wafer 210 with the support substrate 222 (in FIG. 2B) is mounted onto a wafer dicing tape 330 with the BSM 224 facing the dicing tape, and then the support substrate 222 is detached from the wafer active side 212, and the adhesive layer 220 is peeled off.

Figure 3A:
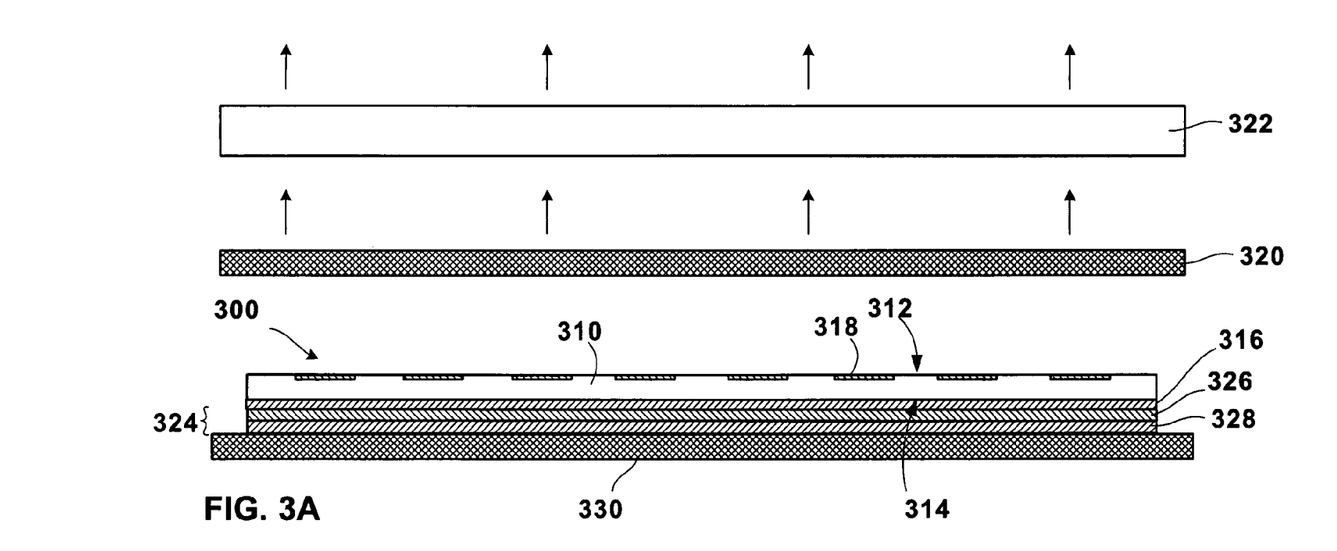
FIG. 3A is an elevational cross-section of a structure according to an embodiment.

FIG. 3A is an elevational cross-section of the wafer 310 on the dicing tape 330. Singulation of dice from the wafer 310 is carried out by conventional technique according to an embodiment. In an embodiment, the wafer 310 is scribed and sawn asunder into dice. In an embodiment, the wafer 310 is laser-exposed and singulated into dice according to known technique. In an embodiment, the wafer 310 is prepared with scribe lines and cracker holes, and singulated into dice according to known technique.

Figure 3B:
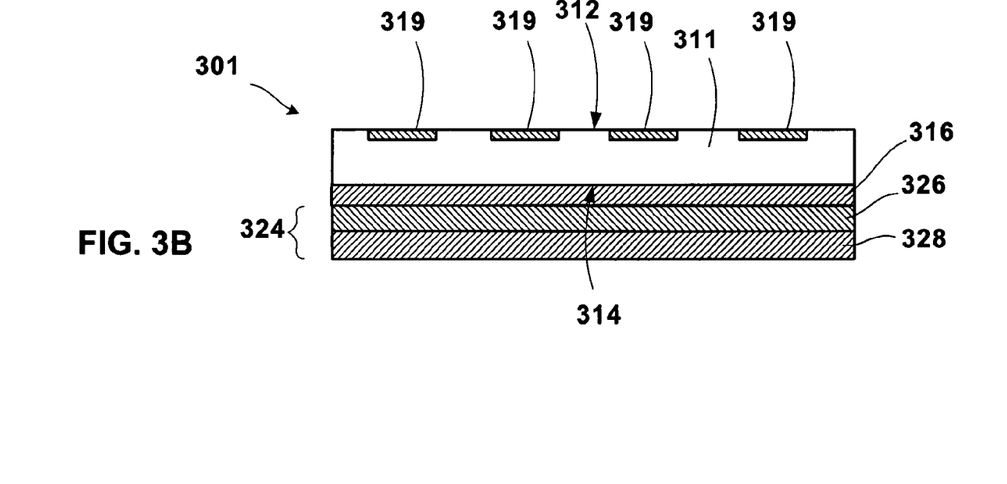
FIG. 3B is an cross-section elevation of the structure depicted in FIG. 3A after further processing according to an embodiment.

FIG. 3B is a cross-section elevation of the structure depicted in FIG. 3A after further processing according to an embodiment. The structure 301 includes a die 311, which was singulated from the wafer 310 depicted in FIG.3A. The die 311 includes the active surface 312 and the backside surface 314 according to an embodiment. The BSM 316 and the solder-laminate precursor 324 are present. The solder-laminate precursor 324 includes the first layer 326 and the subsequent layer 328. The die 311 also depicts bond pads on the active surface 312 which are schematically depicted in four occurrences with the reference numerals 319.

Figure 4:
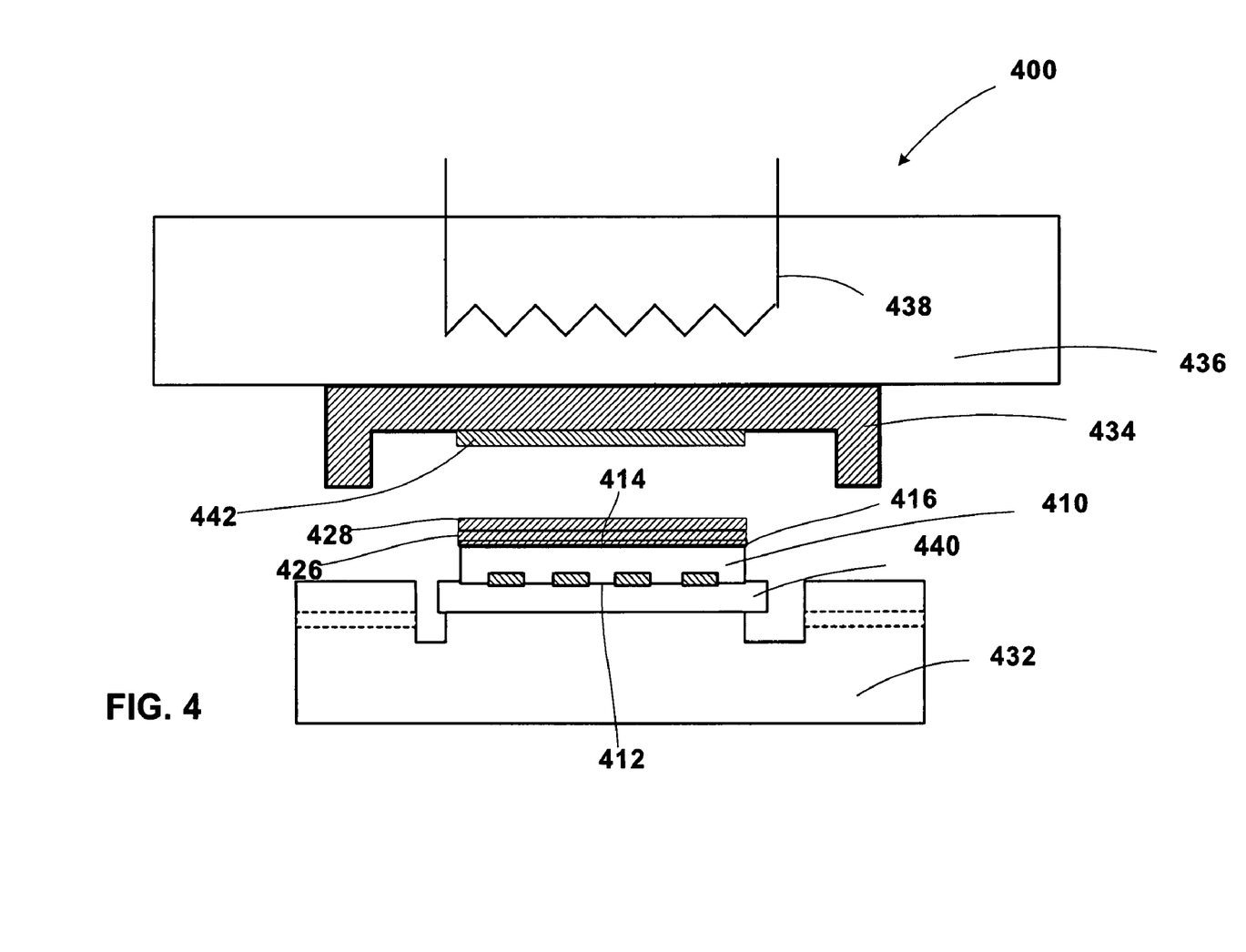
FIG. 4 is an elevational cross-section of a semiconductor article during processing according to an embodiment.

FIG. 4 is an elevational cross-section of a semiconductor article 400 during processing according to an embodiment. A die 410 is disposed upon a die pedestal 432 according to an embodiment. In an embodiment, the die 410 is prepared with a BSM 416, disposed against the die 410 on the backside surface 412 thereof. Additionally in an embodiment, the BSM 416 has been further prepared with a solder-laminate precursor that includes a first layer 426 and a second layer 428. A heat spreader 434 is also present, which is attached to a heat-spreader support platen 436 according to an embodiment. In-an embodiment, a heating element 438 is present in the heat-spreader support platen 436. The heating element 438 is depicted as a resistor, but any heating method may be used to achieve embodiments of the semiconductor article, which includes a solder TIM, e.g., the solder-laminate precursor 324 depicted in FIG. 3B.

The die 410 is mated at the active surface 412 with a flexible pad 440 such that during the pressing process, the die is protected from cracking. The heat spreader 434 is also prepared with a cladding 442. In an embodiment, cladding 442 is restricted in area to about that of the die backside surface 412 area. Accordingly, the cladding 442 can be the only active cladding upon the heat spreader 434. Accordingly, the cladding 442 results in significantly less use of materials than if the cladding were to cover the entire heat spreader 434, as was conventional. In an embodiment, the cladding 442 is a nickel/gold laminate such as the structure 22 in FIG. 1.

Figure 5:
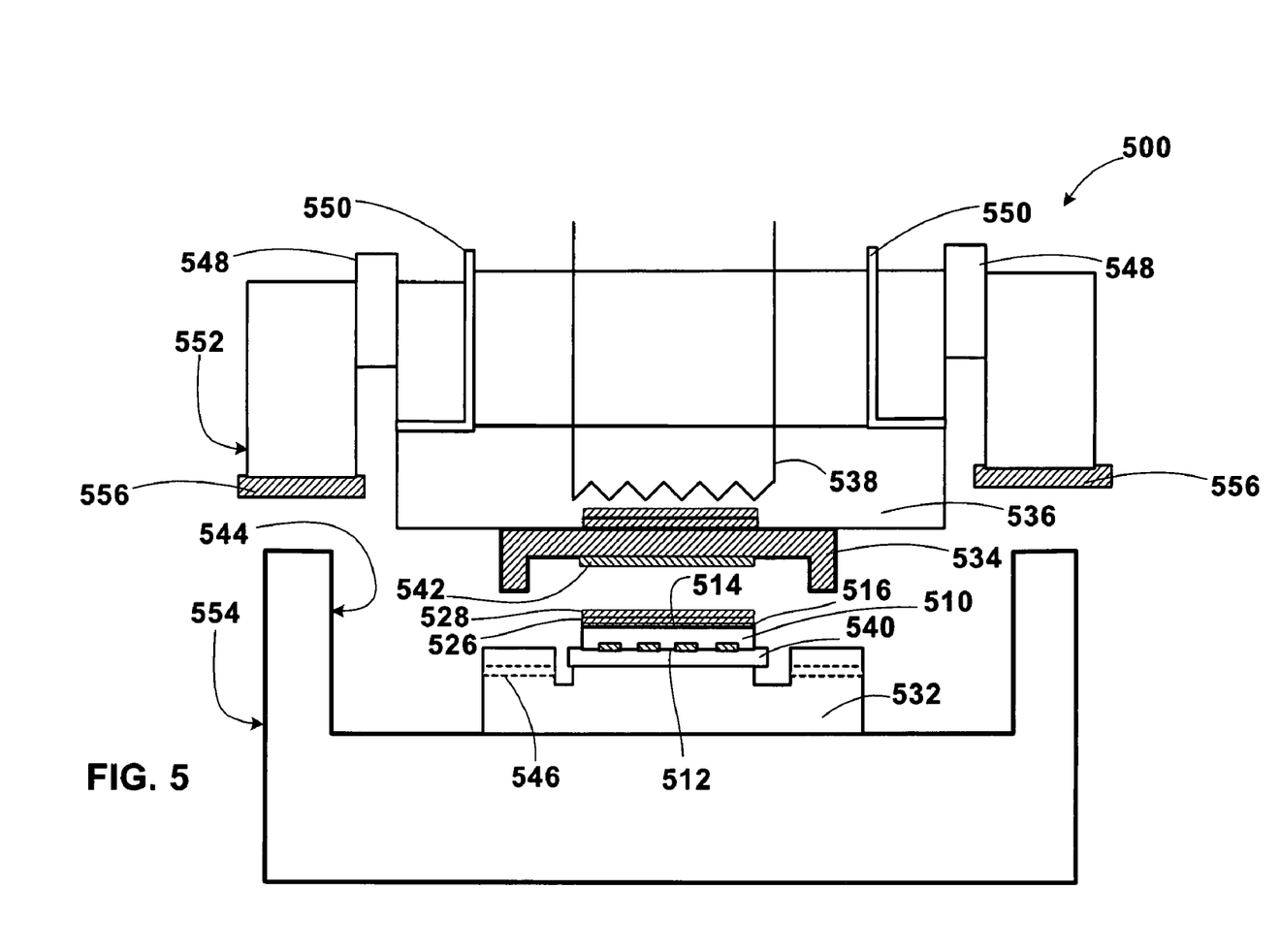
FIG. 5 is an elevational cross-section of a tool for achieving a bonded die and heat spreader with a solder TIM according to an embodiment.

FIG. 5 is an elevational cross-section of a tool 500 for achieving a bonded die and heat spreader with a solder TIM according to an embodiment. A die 510 is disposed upon a die pedestal 532, which is located in a die pocket 544 according to an embodiment. The die 510 is mated at the active surface 512 to a flexible pad 540 such that during the pressing process, the die is protected from cracking.

A heat spreader 534 is also present, which is attached to a heat-spreader support platen 536 according to an embodiment. In an embodiment, a heating element 538 is present in the heat-spreader support platen 536. A heating element 538 is depicted as a resistor, but any heating method may be used to achieve embodiments of the semiconductor article, which includes a solder TIM, e.g., the solder TIM 12 in FIG. 1.

In an embodiment, the die 510 is prepared with a cladding layer 516, disposed against the die 510 on the back side 514 thereof. Additionally in an embodiment, the cladding layer 516 has been further prepared with a solder-precursor first layer 526 and a solder-precursor second layer 528. The heat spreader 534 is also prepared with a cladding 542. According to an embodiment, the cladding 542 has a footprint that is substantially equal to or less than the area and dimension of the die 510. Accordingly, the cladding 542 results in significantly less use of materials for useful cladding that must interface with a die.

The tool 500 provides a chamber for the die 510 and the heat spreader 534, in which the reflowed solder TIM can be formed. Adjacent the die pocket 544, the tool 500 includes a gas-pressure reduction via 546 that allows for the exit flow of gas proximate the die 510 and the heat spreader 534. In an embodiment, the tool 500 includes a gas-pressure reduction conduit 548 and an inert-gas purge conduit 550. The gas-pressure reduction conduit 548 is supported by a vacuum pump that allows for at least partial evacuation of the tool 500. The inert-gas purge conduit 550 is supported by an inert gas source that allows for flushing out the tool 500 before a process of forming the intermetallic TIM. By operating the gas-pressure reduction conduit 548 in combination of with the inert-gas purge conduit 550, processing can be accomplished without the need to prepare the die 510 and/or the heat spreader 534 with fluxing compounds.

Preparation of the tool 500 includes bringing together an upper section 552 and a lower section 554, and mating them with a vacuum seal 556. Operation of the tool 500 includes elevating the temperature of the heat-spreader support platen 536, to a temperature of about the liquidus point of either solder-precursor layer 526 or 528. Heating, as stated, is carried out by activating the heating element 538 according to an embodiment. After bringing the upper section 552 and the lower section 554 together, ambient gases are removed by flushing the tool 500 with an inert gas therewithin. Additionally according to an embodiment, the tool 500 is pressure reduced to further prevent unwanted oxidation of the solder-precursor layer materials during eutectic reflow.

Figure 6:
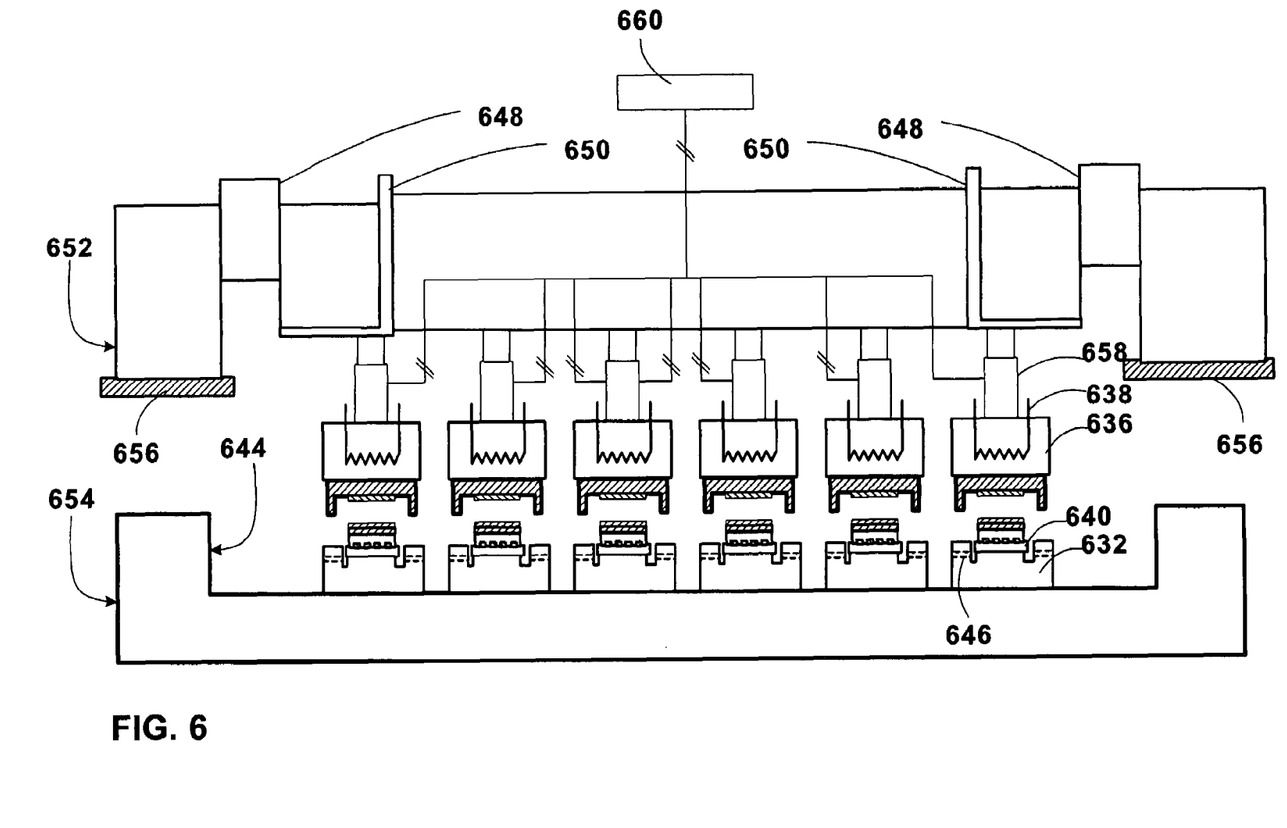
FIG. 6 is an elevational cross-section of a tool for achieving a plurality of parallel-processed solder-bonded dies and heat spreaders, which have solder TIMs according to an embodiment.

FIG. 6 is an elevational cross-section of a tool 600 for achieving a plurality of parallel-processed solder-bonded dies and heat spreaders that have solder TIMs according to an embodiment. The tool 600 includes a plurality of die pedestals 632, one of which is enumerated, and each of which is located in a die pocket 644 according to an embodiment. A plurality of flexible pads 640 are also provided upon the pedestals 632 such that during the pressing process, the dice are protected from cracking. For each unit within the tool 600, a piston 658 is provided, such that each die being bonded to a heat spreader is afforded individual attention for heat and pressure processing.

In an embodiment, the piston 658, as well as the heating element 638, raising and lowering of the upper section 652, and activation of the vacuum 648 and purge 650 systems are operated by a control box 660, which is operated by a feedback control system. In an embodiment, the feedback control system includes a multiplexer (MUX), which monitors time, pressure, and temperature for each die pedestal 632. In an embodiment, a proportional (P) control algorithm is used. In an embodiment, a proportional-integral (PI) control algorithm is used. In an embodiment, a proportional-integral-derivative (PID) control algorithm is used. Other control algorithms may be used according to a specific application. In an embodiment, a heat sensor is located as part of the die pad 640. Similar to a waffle iron sensor, when a known temperature is achieved through the heat sensor, a "$T_{setpoint}$" signal is sent to the control box 660.

A heat-spreader support platen 636 is also present according to an embodiment. In an embodiment, a heating element 638 is present in the heat-spreader support platen 636. The heating element 638 is depicted as a resistor, but any heating method may be used to achieve embodiments of the semiconductor article, which includes a reflowed solder TIM, e.g., the solder TIM 12 depicted in FIG. 1.

By combined use of the gas-pressure reduction conduit 648 and the inert-gas purge conduit 650, processing can be accomplished without the need to prepare the die and/or the heat spreaders with fluxing compounds.

Preparation of the tool 600 includes bringing together the upper section 652 and the lower section 654, and mating them with a vacuum seal 656. Operation of the tool 600 includes elevating the temperature of the heat-spreader support platen 636, to a temperature below the liquidus point of either solder-precursor layer material. Heating, as stated, is carried out by activating the heating element 638 according to an embodiment. After bringing the upper section 652 and the lower section 654 together, ambient gases are removed by flushing the tool 600 with an inert gas therewithin.

In an embodiment, processing conditions include reduced atmosphere, heating, and pressing the solder-precursor layer materials between the die and the heat spreader.

Reference is again made to FIG. 5. In an embodiment, an 80:20 gold-tin solder-precursor laminate 526 and 528 is used between a semiconductive die structure and a copper-metal heat spreader structure 534. In a first example, a silicon die 510 is presented within the tool 500 along with an IHS 534 that is heat spreader-grade copper. A nickel-gold cladding layer 542 is pre-deposited on the IHS 534. The nickel-gold cladding layer 542 has substantially the same area and dimensions as the die 510. An 80:20 gold-tin solder precursor laminate 526 and 528, respectively, is pre-deposited on the die 510.

The chamber is sealed, and a nitrogen gas purge is conducted until substantially all the air has been removed from within the tool 500. Next, a vacuum is begun to be established by pumping the nitrogen gas from the chamber. During purge and/or vacuum pumping the heat spreader 534 is preheated by turning on the heating element 538 within the heat-spreader support platen 536. The heat spreader 534, in this embodiment an IHS 534, is heated in a range from about 280° C. to about 330° C., and next, the IHS 534 is pressed onto the die 510 under pressure sufficient at these conditions to cause solder laminate reflow and bonding. Pressing lasts about 10 seconds, and the pressure does not crack the die 510, which has been thinned in a thickness ranging from about 0.5 mm to about 3 mm.

In a second example, the processing temperature is in a range from 260° C. to about 350° C. The pressing time is in a range from out 1 second to about 1 minute. In a third example, the processing temperature is in a range from about 270° C. to about 340° C. The pressing time is in a range from out 1 second to about 1 minute. In a fourth example, the processing temperature is in a range from about 280° C. to about 330° C. The pressing time is in a range from out 1 second to about 1 minute.

In a fifth example, any of the herein-disclosed monometallic, bimetallic or trimetallic solder-precursor systems are employed, and heating and pressing time are adjusted to achieve a reflowed solder TIM with substantially no voids.

Figure 7:
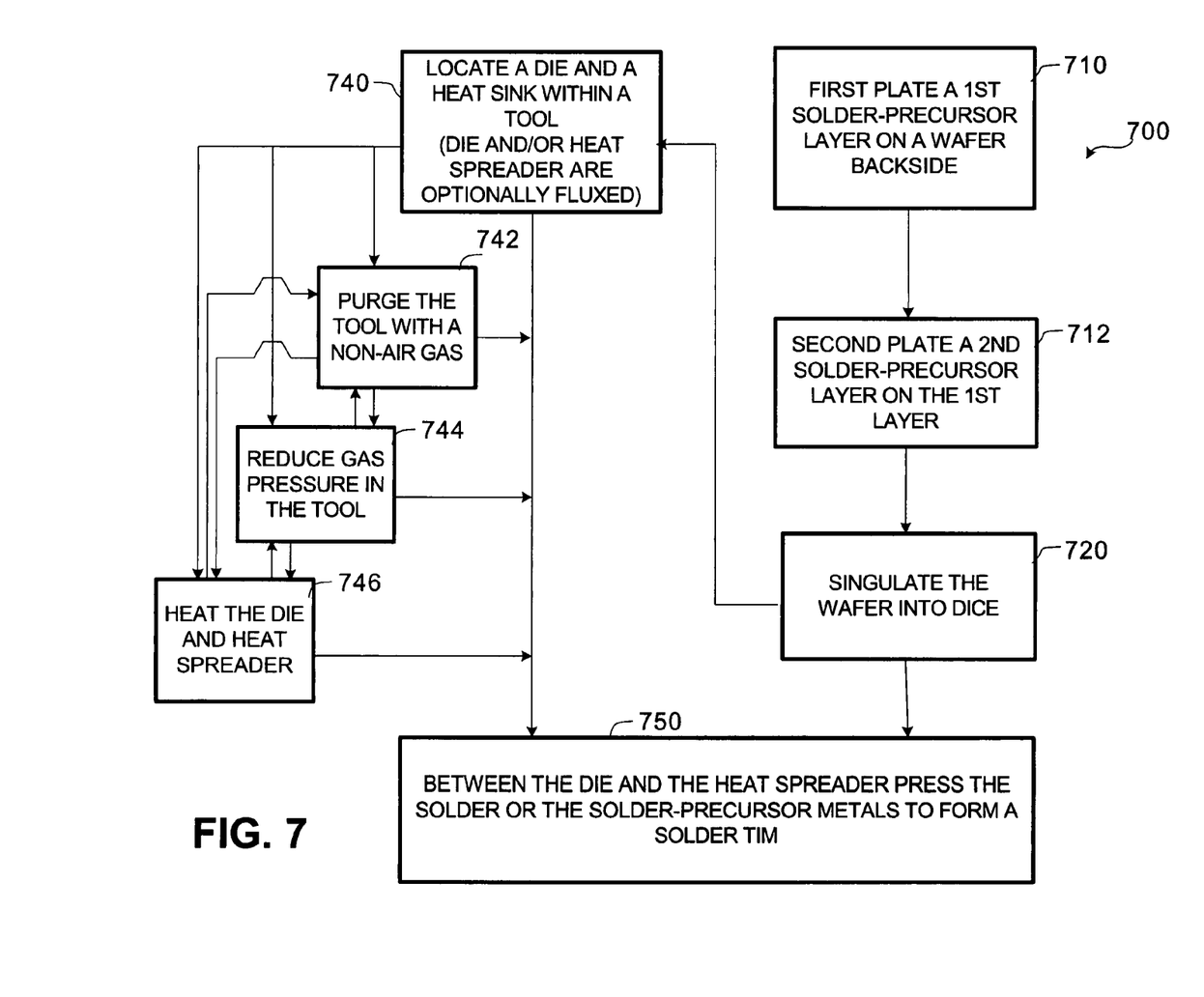
FIG. 7 is a flow chart that describes a process flow according to an embodiment.

FIG. 7 is a flow chart 700 that describes a process flow according to an embodiment. The various processes are depicted in schematic form and several incidental processes are not illustrated for simplicity.

At 710 the process includes first forming a first solder TIM precursor layer above a wafer backside. Processing includes electroplating according to an embodiment.

At 712 the process includes subsequent forming a subsequent solder TIM precursor layer above the first solder TIM precursor layer. Processing includes electroplating according to an embodiment.

At 720 the process includes mounting wafer with the support substrate on a wafer-dicing tape, detaching the support substrate, and then singulating the wafer. In an embodiment, the process terminates at 720.

At 730 the process includes locating a die and a heat spreader within a tool according to an embodiment. The process at 730 can include processing several dice as illustrated in FIG. 6 and described herewithin.

At 740, the process includes pressing the die and heat spreader with the at least one solder precursor metal layer, between the die and the heat spreader, under conditions that form a reflowed solder TIM. In an embodiment, the process commences and finishes at 740. In an embodiment, the process commences at 730 and finishes at 750. In an embodiment, the process flows from 710 through 720. Then the process flows from 730 to 740 and terminates.

At 732, the process includes purging the tool. Purging the tool allows for a substantially oxidation-free atmosphere. A substantially oxidation-free atmosphere can eliminate oxide formations on the solder precursors, such that a selected amount of a reflowed solder TIM is formed. In an embodiment, the process includes purging 732 and pressing 740, after which it terminates at 740.

At 734, the process includes evacuating the tool to a requisite low pressure to assure significant, unoxidized contact between the at least two solder precursor materials, such that a selected amount of a reflowed solder TIM is formed. In an embodiment, the process includes purging 732 and pressing 740, besides evacuating, 734, after which it terminates at 740.

At 736, the process includes heating the heat spreader to a requisite temperature to form a reflowed solder TIM-bonding of the die and heat spreader. Because of processing conditions including purging and evacuating, as well as the purity of the solder-precursor metals, unoxidized contact between the at least two solder-precursor metals is achieved, such that a selected amount of a reflowed solder TIM is formed. In an embodiment, the process includes purging 732, vacuum pumping 734, and pressing 740, besides heating 736, after which it terminates at 740.

Figure 8:
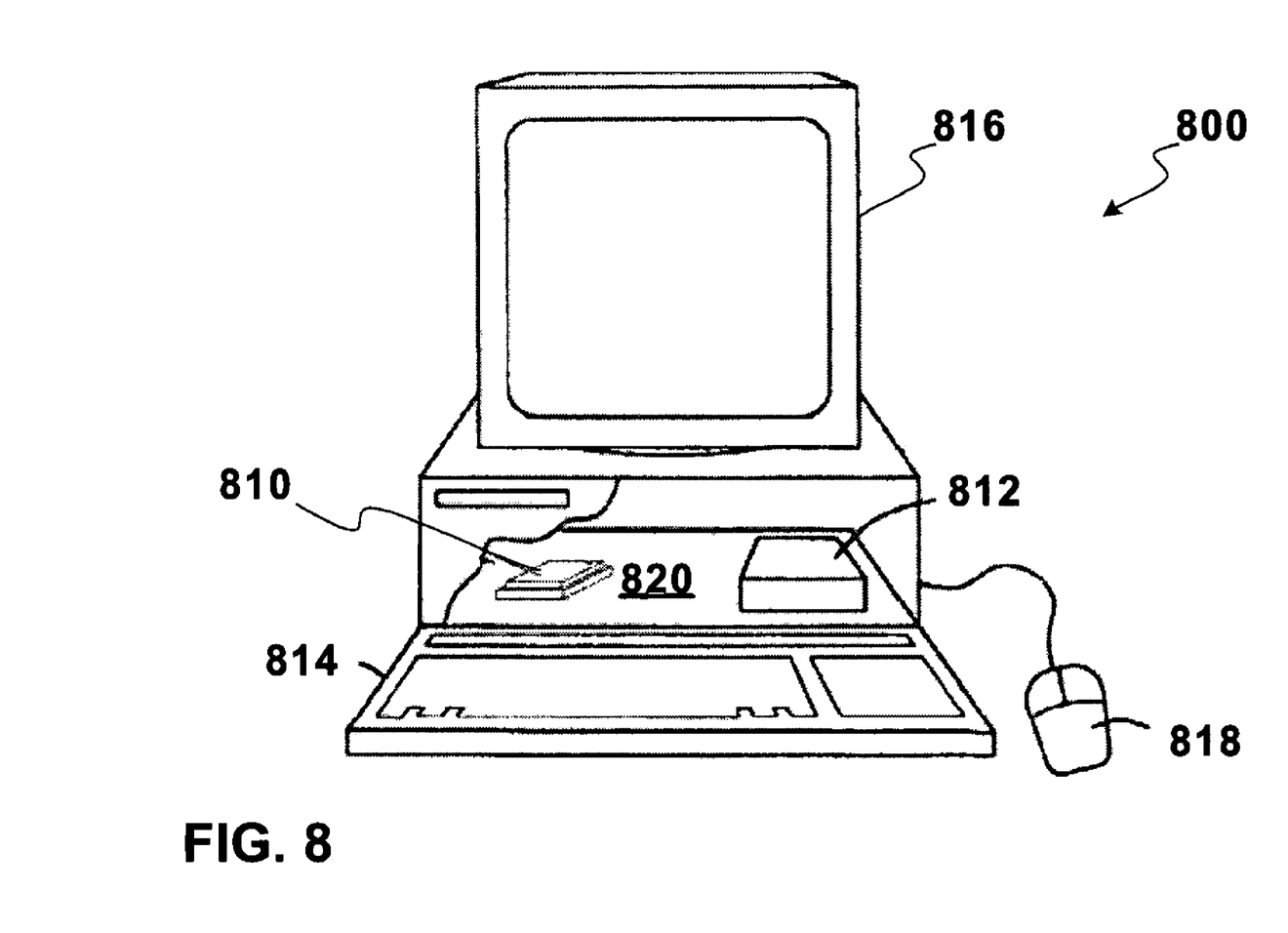
FIG. 8 is a cut-away elevation that depicts a computing system according to an embodiment.

FIG. 8 is a cut-away elevation that depicts a computing system 800 according to an embodiment. One or more of the foregoing embodiments of the reflowed solder TIM structures may be utilized in a computing system, such as a computing system 800 of FIG. 8. Hereinafter any reflowed solder TIM embodiment alone or in combination with any other embodiment is referred to as an embodiment(s) configuration.

The computing system 800 includes at least one processor (not pictured), which is enclosed in a package 810, a data storage system 812, at least one input device such as a keyboard 814, and at least one output device such as a monitor 816, for example. The computing system 800 includes a processor that processes data signals, and may include, for example, a microprocessor, available from Intel Corporation. In addition to the keyboard 814, the computing system 800 can include another user input device such as a mouse 818, for example. The computing system 800 can include a structure, after processing as depicted in FIG. 1, including the die 14, the solder TIM 12, and the IHS 16.

For purposes of this disclosure, a computing system 800 embodying components in accordance with the claimed subject matter may include any system that utilizes a microelectronic device system, which may include, for example, at least one of the reflowed solder TIM structure embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 812.

In an embodiment, the computing system 800 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 820. In this embodiment, an embodiment(s) configuration is coupled to the DSP, and a separate embodiment(s) configuration may be present that is coupled to the processor in the package 810. Additionally in an embodiment, an embodiment(s) configuration is coupled to a DSP that is mounted on the same board 820 as the package 810. It can now be appreciated that the embodiment(s) configuration can be combined as set forth with respect to the computing system 800, in combination with an embodiment(s) configuration as set forth by the various embodiments of the solder TIM within this disclosure and their equivalents.

It can now be appreciated that embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A process comprising:
preparing a wafer, wherein the wafer includes an active surface and a backside surface;
forming a solder layer upon the wafer backside surface, wherein plating the solder precursor includes plating a thermal interface material (TIM) that has a void presence of less than or equal to about 1%;
mating the active surface to a wafer support substrate; and
thinning the wafer to a thickness in a range from about 10 micrometer (μm) to about 300 μm.

2. The process of claim 1, further including dicing the wafer.

3. The process of claim 1, further including:
dicing the wafer, to achieve at least one die; and
bonding the die to a heat spreader with the solder layer.

4. The process of claim 1, further including:
dicing the wafer, to achieve at least one die; and
bonding the die to a heat spreader with the solder layer, wherein bonding is carried out in a temperature range from about 150° to about 330° C.

5. The process of claim 1, after forming a solder layer, the process further including:
mounting the solder layer upon a wafer-dicing tape;
detaching the wafer support substrate;
removing the adhesive layer; and
dicing the wafer.

6. The process of claim 1, after forming a solder layer, the process further including:
mounting the solder layer upon a wafer-dicing tape;
detaching the wafer support substrate;
removing the adhesive layer;
dicing the wafer, to achieve at least one die; and
bonding the die to a heat spreader with the solder layer.

7. The process of claim 1, after forming a solder layer, the process further including:
mounting the solder layer upon a wafer-dicing tape;
detaching the wafer support substrate;
removing the adhesive layer;
dicing the wafer, to achieve at least one die; and
bonding the die to a heat spreader with the solder layer, wherein bonding is carried out in a temperature range from about 150° to about 330° C.

8. The process of claim 1, forming the solder layer is a process selected from electroplating, electroless plating, chemical vapor deposition, physical vapor deposition, and combinations thereof.

9. The process of claim 1, wherein forming the solder is a process selected from forming a solder, a gold-tin solder, a copper-tin solder, a tin-indium solder, a copper-tin-indium solder, a gold-copper-tin solder, a tin solder, a indium solder, and combinations thereof.

10. The process of claim 1, wherein the forming the solder includes first plating a first layer against the die backside surface, and subsequent plating a subsequent layer against the first layer.

11. The process of claim 1, wherein forming the solder layer includes electroplating a gold-tin solder-laminate precursor.

12. The process of claim 1, wherein forming the solder layer includes electroplating an 80:20 gold-tin solder, including first plating a gold first layer, followed by second plating a tin subsequent layer.

13. The process of claim 1, wherein forming the solder layer includes forming a solder-laminate precursor layer in a range from about 2 μm to about 20 μm.

14. A process comprising:
preparing a wafer, wherein the wafer includes an active surface and a backside surface;
mating the active surface to a wafer support substrate;
thinning the wafer by backside grinding
plating a gold-tin solder-laminate precursor upon the wafer backside surface, wherein plating the solder precursor includes plating a thermal interface material (TIM) that has a void presence of less than or equal to about 1%;
mounting the wafer upon wafer-dicing tape;
detaching the wafer support substrate;
removing the adhesive layer; and
dicing the wafer.

15. The process of claim 14, further including:
bonding the die to a heat spreader by reflowing the gold-tin solder-laminate precursor.

16. The process of claim 14, further including:
bonding the die to a heat spreader by reflowing the gold-tin solder-laminate precursor, wherein bonding is carried out in a temperature range from about 290° to about 320° C.

17. The process of claim 14, further including bonding the die to an integrated heat spreader.

18. A process comprising:
preparing a wafer, wherein the wafer includes an active surface and a backside surface;
thinning the wafer by backside grinding;
plating a solder precursor upon the wafer backside surface; and followed by
dicing the wafer, wherein plating the solder precursor includes plating a thermal interface material (TIM) that has a void presence of less than or equal to about 1%.

19. The process of claim 18, wherein dicing the wafer achieves at least one die, the process further including:
bonding the die to a heat spreader by reflowing the solder precursor.

20. The process of claim 18, wherein dicing the wafer achieves at least one die, the process further including:
bonding the die to a heat spreader by reflowing the solder precursor, wherein bonding is carried out in a temperature range from about 290° to about 320° C.

21. The process of claim 18, wherein dicing the wafer achieves at least one die, the process further including bonding the die to an integrated heat spreader.

22. The process of claim 16, wherein plating the solder precursor includes plating a thermal interface material (TIM) layer including a gold-tin composition.

23. The process of claim 16, wherein thinning the wafer by backside grinding achieves a thinned wafer with a thickness in a range from about 10 μm to about 300 μm, and wherein the wafer includes a backside metallurgy (BSM) layer including a refractory metal.

24. The process of claim 16, wherein plating the solder precursor includes achieving a solder precursor in a thickness range from about 2 μm to about 50 μm.

* * * * *

UNITED STATES PATENT AND TRADEMARK OFFICE
CERTIFICATE OF CORRECTION

PATENT NO. : 7,288,438 B2
APPLICATION NO. : 11/116554
DATED : October 30, 2007
INVENTOR(S) : Lu It is certified that error appears in the above-identified patent and that said Letters Patent is hereby corrected as shown below:

On the face page, in "Primary Examiner", in column 2, line 1, delete "David W. Coleman" and insert -- W. David Coleman --, therefor.

In column 11, line 4, in Claim 22, delete "claim 16," and insert -- claim 18, --, therefor.

In column 11, line 7, in Claim 23, delete "claim 16," and insert -- claim 18, --, therefor.

In column 12, line 4, in Claim 24, delete "claim 16," and insert -- claim 18, --, therefor.

Signed and Sealed this

Tenth Day of June, 2008

JON W. DUDAS
*Director of the United States Patent and Trademark Office*